United States Patent [19]
Murakami et al.

[11] Patent Number: 6,033,976
[45] Date of Patent: Mar. 7, 2000

[54] OHMIC ELECTRODE, ITS FABRICATING METHOD AND SEMICONDUCTOR DEVICE

[75] Inventors: Masanori Murakami; Takeo Oku, both of Kyoto; Akira Otsuki, Shiga, all of Japan

[73] Assignee: Sony Corporation, Tokyo, Japan

[21] Appl. No.: 08/852,923

[22] Filed: May 8, 1997

Related U.S. Application Data

[60] Continuation of application No. 08/392,227, Feb. 22, 1995, abandoned, which is a division of application No. 08/282,488, Aug. 1, 1994, abandoned.

[30] Foreign Application Priority Data

Aug. 11, 1993 [JP] Japan .............................. P05-237122

[51] Int. Cl.$^7$ ................................................ H01L 21/441
[52] U.S. Cl. ...................... 438/602; 438/604; 438/606; 438/605
[58] Field of Search ................................. 438/602, 604, 438/606, 605, 607

[56] References Cited

U.S. PATENT DOCUMENTS

| | | |
|---|---|---|
| 4,228,455 | 10/1980 | Yasuda et al. . |
| 5,045,408 | 9/1991 | Williams et al. . |
| 5,309,022 | 5/1994 | Gill et al. .............................. 257/743 |
| 5,317,190 | 5/1994 | Fleischman et al. ................... 257/743 |
| 5,358,899 | 10/1994 | Fleischman et al. ................... 437/184 |

FOREIGN PATENT DOCUMENTS

| | | |
|---|---|---|
| 0077893 | 5/1983 | European Pat. Off. . |
| 0 323 554 | 9/1989 | European Pat. Off. . |
| 223442 | 9/1990 | Japan . |

OTHER PUBLICATIONS

Journal of Vacuum Science & Technology B. vol. 4, No. 3, May 1986–Jun. 1986 Woodbury, NY, US. pp. 762–768, Taeil Kim et al. "The Effects of Germanium Concentration on the Compound Formation and Morphology of Gold–Based Contacts. Etc".

Thin Solid Films, vol. 147, No. 2, Mar. 2, 1987, Lausanne, Switzerland, pp. 177–192, Taeil Kim et al. In Situ X–Ray Diffraction Study of the Effects of Germanium and Nickel Concentrations of Melting in Gold–Based Contacts to Gallium etc.

Journal of Applied Physics, Vp. 75, No. 5, Mar. 1, 1994, New York pp. 2530–2537, H.R. Kawata et al. "Nice–based ohmic contacts to n–type GaAs II. Effects of Au Addition".

*Primary Examiner*—Caridad Everhart
*Attorney, Agent, or Firm*—Hill & Simpson

[57] ABSTRACT

It is intended to realize an ohmic electrode for III–V compound semiconductors such as GaAs semiconductors which has practically satisfactory characteristics. Provided on an $n^+$-type GaAs substrate is an ohmic electrode in which an $n^{++}$-type regrown GaAs layer regrown from the $n^+$-type GaAs substrate and a NiGe film containing precipitates composed of $\alpha'$-AuGa are sequentially stacked. The ohmic electrode may be fabricated by sequentially stacking a Ni film, Au film and Ge film on the $n^+$-type GaAs substrate, then patterning these films by, for example, lift-off, and thereafter annealing the structure at a temperature of 400~750° C. for several seconds to several minutes.

68 Claims, 8 Drawing Sheets

OHMIC ELECTRODE, ITS FABRICATING METHOD AND SEMICONDUCTOR DEVICE

This is a continuation, of application Ser. No. 08/392,227 filed Feb. 22. 1995 abandoned, which division, of application Ser. No. 08/282,488, filed Aug. 1, 1994, abandoned.

BACKGROUND OF THE INVENTION

1. Field of the Invention

The present invention relates to an ohmic electrode, its fabricating method and a semiconductor device, and more particularly the present invention relates to an ohmic electrode for a III–V compound semiconductor, its fabricating method, and a semiconductor device using the ohmic electrode.

2. Description of the Related Arts

From the viewpoint of improving the performance and reliability of a device such as FET using a compound semiconductor, reducing the contact resistance of its ohmic electrode and improving its thermal stability are of great importance. However, with regards to compound semiconductors, particularly, III–V compound semiconductors such as GaAs semiconductors, there have been none that satisfy the above-indicated requirements.

Ohmic electrodes for GaAs semiconductors which have been put in practical use or proposed can generally be classified into the following three types. In ohmic electrodes of the first type, an ohmic metal used includes an element behaving as a donor impurity for GaAs semiconductors. By annealing, the element is diffused in the semiconductor thus making an n-type region having a high impurity concentration along the interface between the electrode metal and the semiconductor such that an ohmic contact is established due to a tunneling effect or the like. In ohmic electrodes of the second type, the ohmic electrode includes an element forming an intermediate layer of a low energy barrier. By annealing, the element makes an intermediate layer of a lower energy barrier between the electrode metal and the semiconductor such that an ohmic contact is established by lowering the energy barrier in the region where carriers move. In ohmic electrodes of the third type, the ohmic electrode includes an element wich reacts with GaAs semiconductors when annealed and makes a regrown semiconductor layer wich behaves as a donor impurity for GaAs semiconductors. By annealing, a regrown layer is formed and changes into an n-type having a high impurity concentration such that an ohmic contact is established due to a tunnelling effect or the like.

Figure 1A:
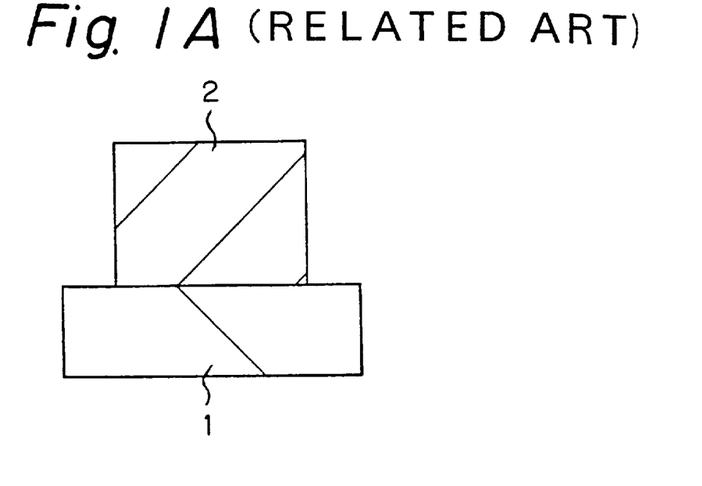
FIGS. 1A and 1B are cross-sectional views for explaining a first example of existing ohmic electrodes.
Figure 1B:
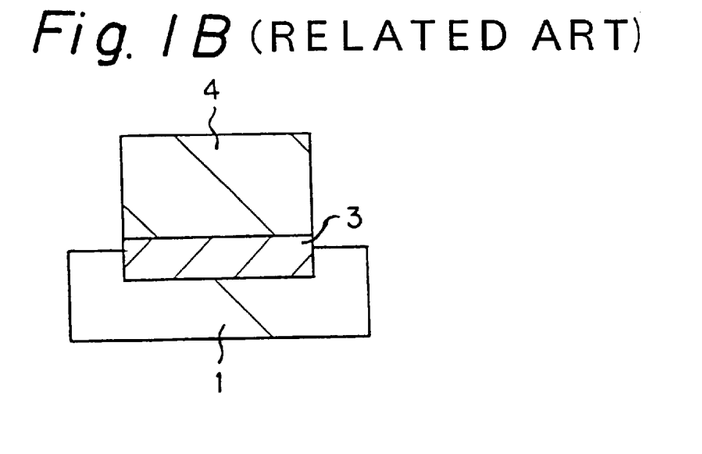

A typical example of ohmic electrodes of the first type is shown in FIGS. 1A and 1B. In this example, an AuGe/Ni film 2 as an ohmic metal is formed on an n$^+$-type GaAs substrate 1 as shown in FIG. 1A. Then, it is annealed at 400~500° C. to make the ohmic electrode as shown in FIG. 1B. In FIG. 1B, reference numeral 3 denotes an n$^{++}$-type GaAs layer, and 4 denotes a layer including NiAs and β-AuGa.

The ohmic electrode shown in FIG. 1B, however, has bad thermal stability. That is, in this case, a large amount of Au contained in the AuGe/Ni film 2 as the ohmic metal (typically used AuGe contains 88% Au) reacts with a n$^+$-type GaAs substrate 1 when annealed at a temperature of 400° C. or higher and forms β-AuGa (hexagonal close packed (HCP) structure, melting point $T_m$=375° C.) in the layer 4. Therefore, although the contact resistance of the ohmic electrode certainly decreases, the thermal stability deteriorates. As a result, the device characteristics deteriorate when a high temperature is applied in a process such as chemical vapor deposition (CVD) executed after the formation of the ohmic electrode. In addition, β-AuGa produced by reaction of the n$^+$-type GaAs substrate 1 with Au in the AuGe/Ni film 2 causes a rough surface of the ohmic electrode and makes subsequent fine patterning difficult.

The ohmic electrode shown in FIG. 1B involves another problem that it cannot cope with thinning for the n$^{++}$-type Gas layer 3 and reduction of size of devices such as a. That is, since the n$^{++}$-type GaAs layer 3 is formed by diffusion during annealing, extension thereof in the depth direction and in the lateral direction (parallel to the substrate) is determined solely by the temperature and the time of the annealing. Therefore, extension of the n$^{++}$-type GaAs layer 3 in the depth and lateral directions cannot be controlled. As a result, it is difficult to reduce the thickness of the n$^{++}$-type GaAs layer 3 and the distances between ohmic electrodes for improving performance and reducing the size of device.

Ohmic electrodes of the second and third types have been proposed to overcome the problems caused by the use of the AuGe/Ni film 2 for fabricating an ohmic electrode in the typical example of the first type, i.e., the thermal instability of the ohmic electrode and a rough surface of the electrode.

Figure 2A:
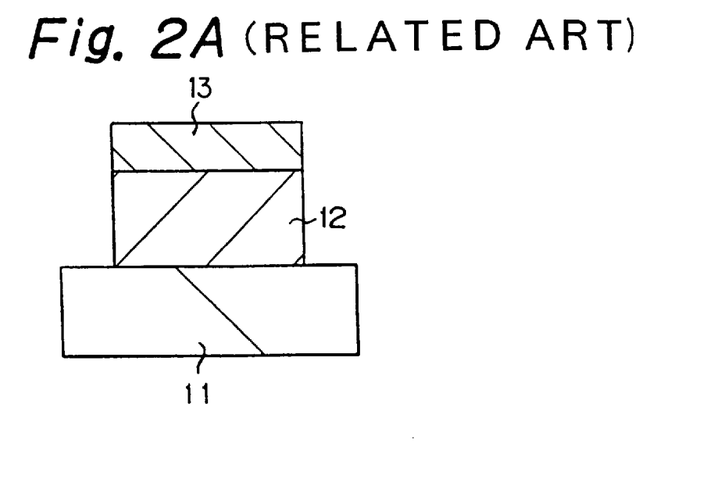
FIGS. 2A and 2B are cross-sectional views for explaining a second example of existing ohmic electrodes.
Figure 2B:
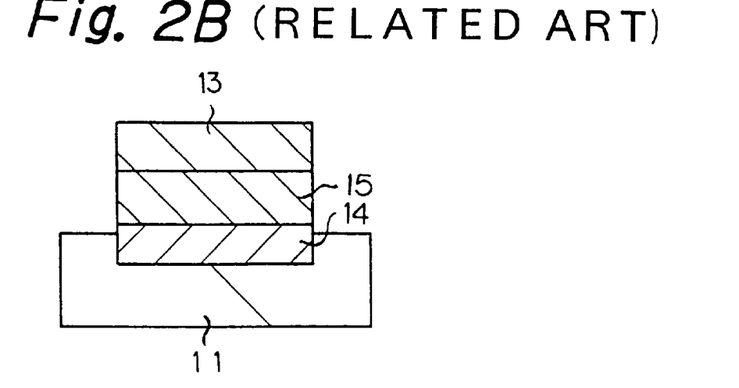

A typical example of ohmic electrodes of the second type is shown in FIGS. 2A and 2B. In this example, sequentially provided on an n$^+$-type GaAs substrate 11 are a NiIn film 12 and a W film 13 as ohmic metals as shown in FIG. 2A. Thereafter, the structure is annealed for a second or so at a high temperature of about 900° C. to form the ohmic electrode as shown in FIG. 2B. In FIG. 2B, reference numeral 14 denotes an InGaAs (abbreviated representation used hereinafter for In$_x$Ga$_{1-x}$As) layer, and 15 denotes a Ni$_3$In film. In this case, the InGaAs layer 14 as an intermediate layer of a low energy barrier is formed by reaction of the n$^+$-type GaAs substrate 11 and In in the NiIn film 12 by annealing, and an ohmic contact is established by a decrease in effective height of the energy barrier. Since the ohmic electrode shown in FIG. 2B does not include a compound such as β-AuGa having a low melting point as included in the ohmic electrode of the first type shown in FIG. 1B, it has been reported that the contact resistance of the ohmic electrode is stable even with annealing at about 400° C. for about 100 hours.

However, since the ohmic electrode shown in FIG. 2B requires annealing at a high temperature of about 900° C. for establishing an ohmic contact, it cannot be used in devices such as a JFET (junction gate FET) and HEMT (high electron mobility transistor) in which a gate and a channel are formed at a temperature below 900° C. Therefore, the ohmic electrode involves the problems that the process window is small and that its use is limited to only a few kinds of devices.

Figure 3A:
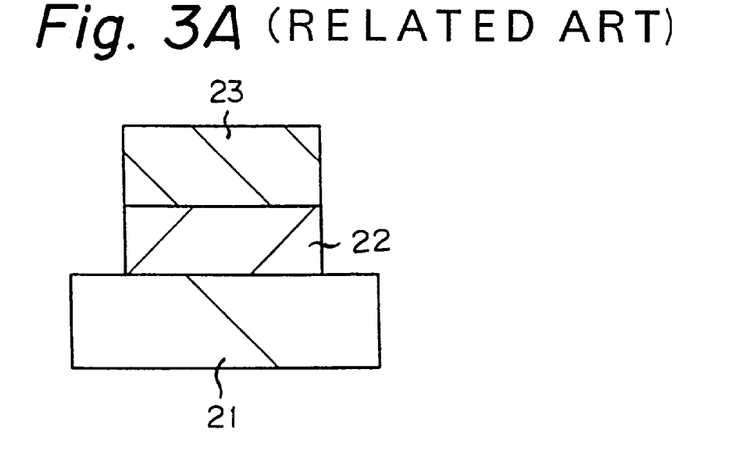
FIGS. 3A and 3B are cross-sectional views for explaining a third example of existing ohmic electrodes.
Figure 3B:
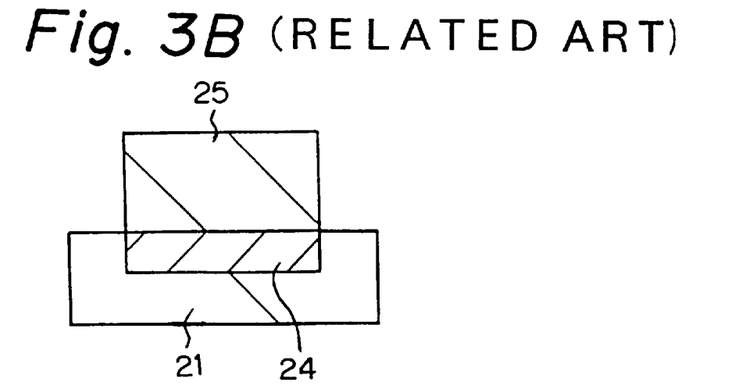

A typical example of ohmic electrodes of the third type is shown in FIG. 3. In this example, sequentially stacked on an n$^+$-type GaAs substrate 21 are a Pd film 22 and a Ge film 23 and ohmic metals as shown in FIG. 3A. The structure is annealed at a bout 325~375° C. for about 30 minutes to form the ohmic electrode as shown in FIG. 3B. In FIG. 3B, reference numerals 24 denotes an n$^{++}$-type GaAs layer, and 25 denotes a PdGe film. In this case, while annealed, a regrown layer of GaAs is first formed from the n$^+$-type Gats substrate 21, and Ge in the Ge film 23 is then diffused into the regrown layer. As a result, the n$^{++}$-type GaAs layer 24 is formed to establish an ohmic contact.

With the ohmic electrode shown in FIG. 3B, the thickness of the regrown n$^{++}$-type GaAs layer 24 can be controlled by changing the thicknesses of the Pd film 22 and the Ge film 23 as ohmic metals. Therefore, the ohmic electrode of this type permits a decrease in thickness of the $n^{++}$-type GaAs layer 24 and in distances between ohmic electrodes. The ohmic electrode shown in FIG. 3B, however, has a serious problem in its thermal stability.

The above-discussed characteristics of the ohmic electrodes of the first, second and third types are summarized in Table 1.

TABLE 1

| type | difficulty of process | contact resistance | thermal stability | surface flatness | short diffusion length |
|---|---|---|---|---|---|
| 1 | good | good | bad | bad | bad |
| 2 | bad | good | good | good | good |
| 3 | good | good | bad | good | good |
| present invention | good | good | good | good | good |

As mentioned above, since existing ohmic electrodes for GaAs semiconductors are unsatisfactory, realization of an ohmic electrode having practically satisfactory characteristics has been desired.

OBJECTS AND SUMMARY OF THE INVENTION

It is therefore a first object of the invention to provide an ohmic electrode for GaAs semiconductor and other III–V compound semiconductors having practically satisfactory characteristics.

A second object of the invention is to provide a method for fabricating an ohmic electrode for readily fabricating an ohmic electrode for GaAs semiconductor and other III–V compound semiconductors which has practically satisfactory characteristics.

A third object of the invention is to provide a semiconductor device including a semiconductor elemental device provided on a GaAs semiconductor or other III–V compound semiconductor body and having an ohmic electrode with practically satisfactory characteristics.

According to an aspect of the invention, there is provided an ohmic electrode, comprising:

a regrown III–V compound semiconductor layer regrown from a III–V compound semiconductor body; and a NiGe film formed on the regrown III–V compound semiconductor layer and including precipitates which are compounds of at least one element selected from a group consisting of Au, Pt, Pd and Ag and a group III element constituting the III–V compound semiconductor body and which has a melting point of 400° C. or higher.

The III–V compound semiconductor body may be a substrate or a layer composed of, for example, GaAs, AlGaAs or InGaAs. If the III–V compound semiconductor body is of an n-type, it includes, for example, Si, Ge, Te or Sn as a donor impurity. The donor impurity is introduced into the III–V compound semiconductor body by, for example, ion implantation, liquid phase epitaxy (LPE), molecular beam epitaxy (MBE) or metal organic vapor phase epitaxy (MOVPE).

The regrown III–V compound semiconductor layer may be a layer composed of, for example, GaAs, AlGaAs or InGaAs. If the III–V compound semiconductor body is of an n-type, the regrown III–V compound semiconductor layer is also of the n-type. In a preferred working form of the ohmic electrode according to the invention, the regrown III–V compound semiconductor layer has a higher impurity concentration than the III–V compound semiconductor body. The higher impurity concentration of the regrown III–V compound semiconductor layer than the III–V compound semiconductor body means that the regrown III–V compound semiconductor layer has lower resistivity than the III–V compound semiconductor body. In a preferred working form of the ohmic electrode according to the invention, the regrown III–V compound semiconductor layer matches in crystal lattice with the III–V compound semiconductor body.

The precipitates contained in the NiGe film typically represent the form of fine particles which are distributed in the NiGe film. From the viewpoint of obtaining good ohmic characteristics, the probability of the presence of the precipitates is preferably small near the interface between the NiGe film and the regrown III–V compound semiconductor layer. Specifically, the probability of the presence along the interface is preferably 50% or less. Also when the precipitates are occasionally distributed also in the regrown III–V compound semiconductor layer, the probability of the presence near the interface between the regrown III–V compound semiconductor layer and the III–V compound semiconductor body is preferably 50% or less. The NiGe film may include a certain amount of substances (such as NiGaAs, for example) other than the precipitates referred to above.

In a preferred working form of the ohmic electrode according to the invention, the III–V compound semiconductor body is an n-type GaAs substrate, the regrown III–V compound semiconductor layer is an n-type GaAs layer, the element selected from the group consisting of Au, Pt, Pd and Ag is Au, and the compound is $\alpha'$-AuGa.

According to another aspect of the invention, there is provided a method for fabricating an ohmic electrode including: a regrown III–V compound semiconductor layer regrown from a III–V compound semiconductor body; and a NiGe film formed on the regrown III–V compound semiconductor layer and including precipitates which are compounds of at least one element selected from a group consisting of Au, Pt, Pd and Ag and a group III element constituting the III–V compound semiconductor body and which has a melting point of 400° C. or higher, comprising the steps of:

sequentially providing on the III–V compound semiconductor body a Ni film, a metal film composed of at least one element selected from a group consisting of Au, Pt, Pd and Ag, and a Ge film; and annealing the III–V compound semiconductor body having thereon the Ni film, the metal film and the Ge film.

The III–V compound semiconductor body may be a substrate or a layer composed of, for example, GaAs, AlGaAs or InGaAs. If the III–V compound semiconductor body is of an n-type, it contains, for example, Si, Ge, Te or Sn as a donor impurity. The regrown III–V compound semiconductor layer is a substrate or a layer composed of, for example, GaAs, AlGaAs or InGaAs. In a preferred working form of the method for fabricating an ohmic electrode according to the invention, the regrown III–V compound semiconductor layer has a higher impurity concentration than the III–V compound semiconductor body.

The metal film may be a single layer composed of only one of an Au film, Pt film, Pd film and Ag film or a multi-layer composed of two or more of the above films. The metal film may also be made of an alloy composed of two or more elements of Au, Pt, Pd and Ag.

In a preferred working form of the method for fabricating an ohmic electrode according to the invention, the III–V compound semiconductor body is an n-type GaAs substrate, the regrown III–V compound semiconductor layer is an n-type GaAs layer, the element selected from the group consisting of Au, Pt, Pd and Ag is Au, the compound is α'-AuGa, and the metal film is an Au film. The α'-AuGa has a face centered cubic (FCC) structure whose melting point $T_m$ is 415° C. which is 40° C. higher than β-AuGa.

When the metal film is an Au film, that is, when a Ni film, Au film and Ge film are used as materials for making the ohmic electrode, the atomic ratio $X_{Ni}/X_{Ge}$ of the Ni film relative to the Ge film ($X_{Ni}$: number of atoms in the Ni film, $X_{Ge}$: number of atoms in the Ge film) is preferably ~1 or less from the standpoint of obtaining a low contact resistance, and preferably ~0.8 from the standpoint of obtaining a good thermal stability as well.

In the method for fabricating an ohmic electrode according to the invention, the annealing temperature is preferably selected in the range of 400~750° C. from the viewpoint of obtaining a low contact resistance. The annealing may be conducted in two divisional steps. More specifically, the first annealing is preferably conducted at a temperature of, for example, 200~400° C. lower than the temperature of the second annealing, and thereafter, the second annealing is preferably conducted at a temperature of 400~750° C.

According to still another aspect of the invention, there is provided a semiconductor device including a semiconductor elemental device on a III–V compound semiconductor body, and the semiconductor elemental device has an electrode comprising:

a regrown III–V compound semiconductor layer regrown from the III–V compound semiconductor body; and a NiGe film formed on the regrown III–V compound semiconductor layer and including precipitates which are compounds of at least one element selected from a group consisting of Au, Pt, Pd and Ag and a group III element constituting the III–V compound semiconductor body and which has a melting point of 400° C. or higher.

The semiconductor elemental device may be a FET such as MESFET, JFET, HEMT and so on, a HBT (heterojunction bipolar transistor), a semiconductor laser, a light emitting diode, or the like.

In a preferred working form of the semiconductor device according to the invention, the regrown III–V compound semiconductor layer has a higher impurity concentration than the III–V compound semiconductor body. In a preferred working form of the semiconductor device according to the invention, the element selected from the group consisting of Au, Pt, Pd and Ag is Au, and the compound is α'-AuGa.

According to the ohmic electrode of the invention, by employing the structure in which the NiGe film having a melting point as high as $T_m$=850° C. contains precipitates such as α'-AuGa which is a compound of at least one element selected from a group consisting of Au, Pt, Pd and Ag and a group III element composing the III–V compound semiconductor body and which has a melting point of 400° C. or higher, a good thermal stability is obtained as compared with an ohmic electrode containing a compound such as β-AuGa having a low melting point. In addition, due to a composite effect obtained by forming the NiGe film on the regrown III–V compound semiconductor layer regrown from the III–V compound semiconductor body, various characteristics other than the thermal stability, namely, low contact resistance, low film resistance, surface flatness, short diffusion length, etc. are also satisfactorily improved. That is, an ohmic electrode can be obtained, which satisfies characteristics required for practical use of devices and facilitates the process taken for fabricating the ohmic electrode.

According to the method for fabricating an ohmic electrode of the invention comprising the above-described steps, an ohmic electrode satisfying various characteristics required for practical use of devices can be readily fabricated.

According to the semiconductor device of the invention having the above-described arrangement, since the ohmic electrode of the semiconductor elemental device satisfies various characteristics required for practical use of such devices, a semiconductor device having high performance can be realized.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Embodiments of the invention will be described below with reference to the drawings.

Figure 4:
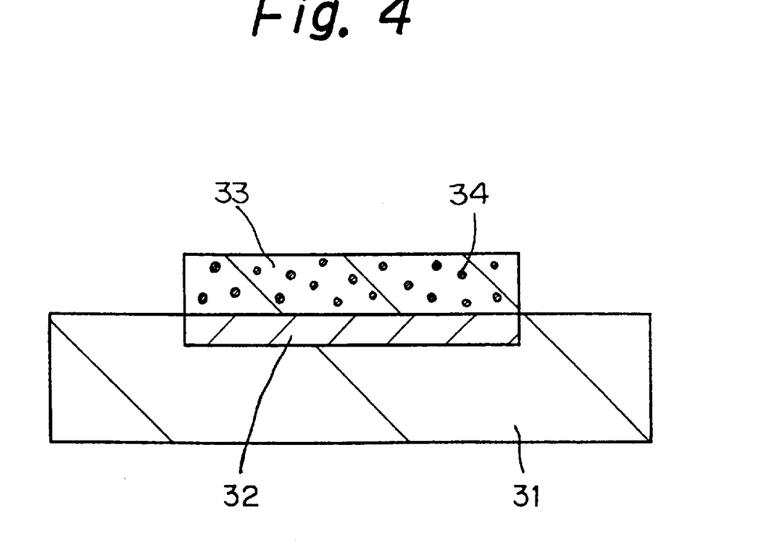
FIG. 4 is a cross-sectional view showing an ohmic electrode according to a first embodiment of the invention.

In a first embodiment of the invention a as shown in FIG. 4, provided on an n⁺-type GaAs substrate 31 is an ohmic electrode made by sequentially stacking an n⁺⁺type Gas layer 32 regrown from the n⁺-type GaAs subtrate 31 and a NiGe film 33. The NiGe film 33 contains a number of fine particles of a precipitate 34 composed of α'-AuGa distributed therein.

Figure 5:
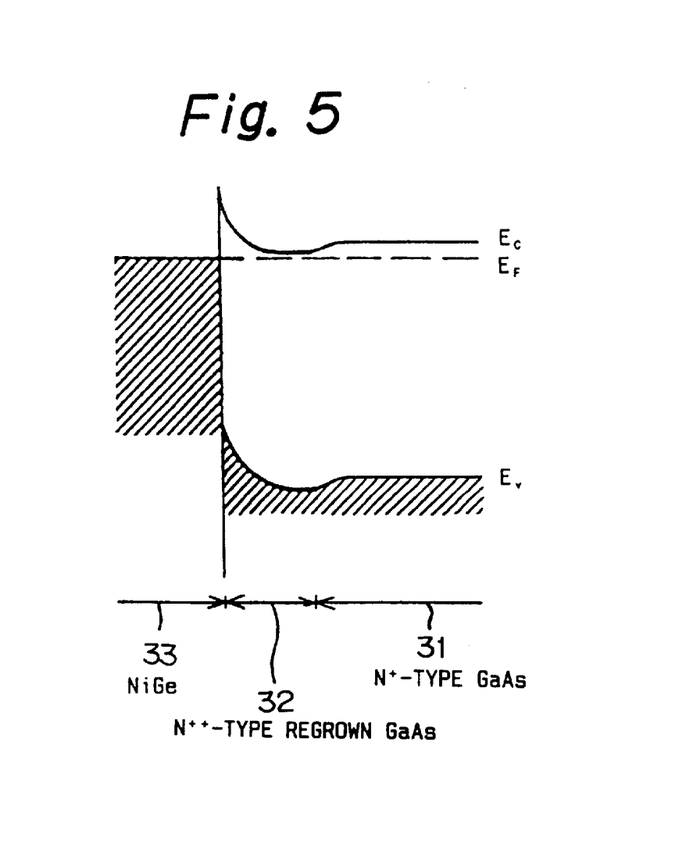
FIG. 5 is an energy band diagram of the ohmic electrode according to the first embodiment of the invention shown in FIG. 4.

FIG. 5 is a energy band diagram of the ohmic electrode according to the embodiment. In FIG. 5, $E_C$ and $E_V$ denote to the bottom energy of the conduction band and the top energy of the valence band, respectively, and $E_F$ denotes the the Fermi energy.

Next explained is a method for fabricating the ohmic electrode according to a second embodiment of the invention.

Figure 6A:
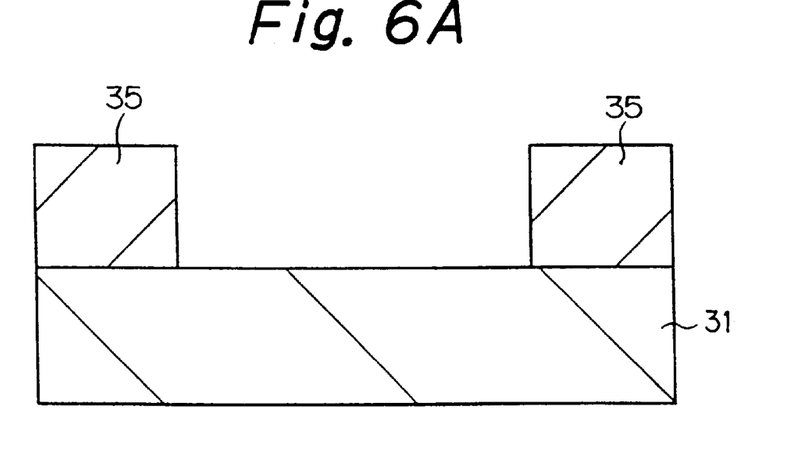
FIGS. 6A to 6C are cross-sectional views for explaining a method for fabricating an ohmic electrode according to a second embodiment of the invention.

As shown in FIG. 6A, a photoresist is applied onto the n⁺-type GaAs substrate 31. The photoresist is then patterned by a photolithographic method into a resist pattern 35 having an opening in the area corresponding to the ohmic electrode to be made. Exposure in the photolithography is conducted by using an optical exposure apparatus such as a reduced projection exposure apparatus (so-called stepper). An electron beam resist and an electron beam lithography method may be used to make the resist pattern 35.

Figure 6B:
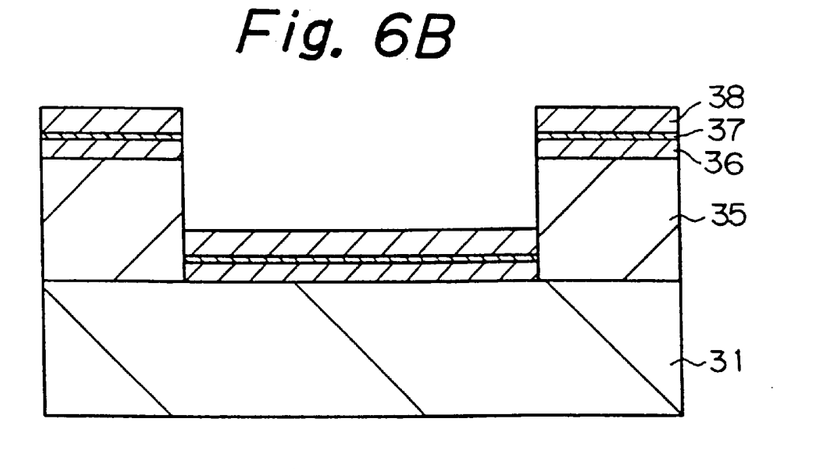

After that, as shown in FIG. 6B, a Ni film 36, an Au film 37 and a Ge film 38 are sequentially provided by, for example, sputtering or vacuum evaporation. The thickness of the resist pattern 35 is determined to be sufficiently larger than the total thickness of the Ni film 36, Au film 37 and Ge film 38.

Figure 6C:
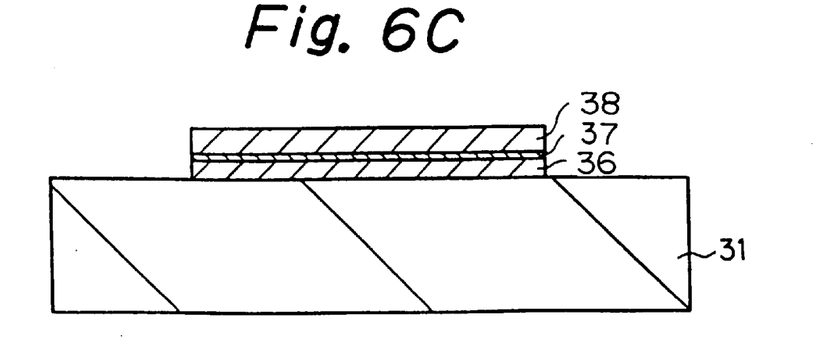

The n⁺-type GaAs substrate 31 provided thereon the Ni film 36, Au film 37 and Ge film 38 is immersed in an organic solvent such as acetone to dissolve the resist pattern 32 off and thereby remove the Ni film 36, Au film 37 and Ge film 38 which were made on the resist pattern 35. As a result, as shown in FIG. 6C, the Ni film 36, Au film 37 and Ge film 38 remain only in the selective area on the n⁺-type GaAs substrate 31 corresponding to the opening of the resist pattern 35.

The n⁺-type GaAs substrate 31 provided thereon the Ni film 36, Au film 37 and Ge film 38 is then annealed by an RTA(Rapid Thermal Annealing) method or conventional furnace annealing method in an atmosphere composed of, for example, N₂ gas with or without a small amount of H₂ gas at the temperature of 400~750° C., more preferably, 450~550° C., for the duration of time ranging from several seconds to several minutes, for example. As a result of the annealing, as shown in FIG. 4, the n⁺⁺-type regrown GaAs layer 32 is formed by regrowth of a GaAs layer from the n⁺-type GaAs substrate 31 and by diffusion of, for example, Ge into the GaAs layer and the NiGe film 33 containing fine particles of the precipitate 34 composed of α'-AuGa is formed on the n⁺⁺-type regrown GaAs layer 32.

In the above-described process, the ohmic electrode composed of the n⁺⁺-type regrown GaAs layer 32 and the NiGe film 33 containing fine particles of the precipitate 34 composed of α'-AuGa is fabricated.

Some samples of the ohmic electrode according to the second embodiment were made, in which the Au films 37 are 5 nm thick, the Ge films 38 are 10 nm thick, thicknesses of the Ni film 36 vary by 4 nm in the range of 36 nm to 60 nm, and the structures after formation of the Ni film 36, Au film 37 and Ge film 38 were annealed at various temperatures for five seconds by the RTA method. By measurement of contact resistances of the samples, it was found that one of the samples with a 40 nm thick Ni film 36 and annealed at 450° C. had a lowest contact resistance, namely, about 0.2 Ωmm. Note that the samples were made by using n⁺-type GaAs substrates 31 prepared by implanting Si ions into (100)-oriented semi-insulating GaAs substrates to exhibit an n-type with the impurity concentration of 2×10¹⁸ cm⁻³. The n⁺⁺-type regrown GaAs layers 32 were doped with Ge to the degree of the impurity concentration of 1×10¹⁹ cm⁻³. The Ni films 36 and the Ge films 38 were made by a vacuum evaporation method using an electron beam, and the Au films 37 were made by a vacuum method evaporation method combined with resistance heating.

Figure 7:
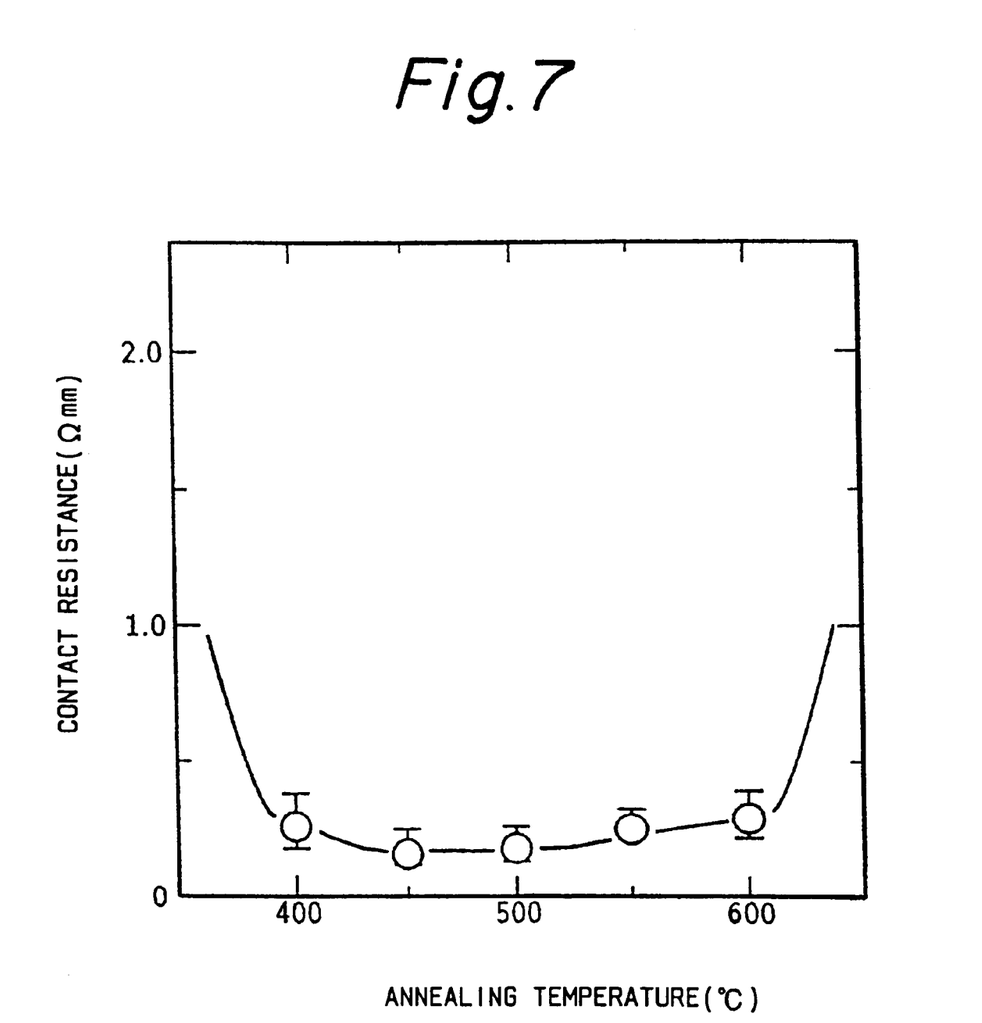
FIG. 7 is a graph showing a result of measurement of changes in contact resistance of the ohmic electrode according to the first embodiment with annealing temperatures.

FIG. 7 shows measured contact resistances of ohmic electrodes as functions of the annealing temperatures as to some of the samples each having a 40 nm thick Ni film 36, 5 nm thick Au film 37 and 100 nm thick Ge film 38, and annealed at various temperatures in the range of 400~600° C. for five seconds by the RTA method in an atmosphere composed of N₂ gas added with 5% of H₂ gas. FIG. 7 shows that a lowest contact resistance, about 0.2 Ωmm, is obtained when the annealing temperature is 450° C. The measurement of contact resistances was conducted by TLM (transmission line method). The sheet resistance of the ohmic electrode was also measured and revealed to be a significantly low value of about 2Ω/□.

Figure 8:
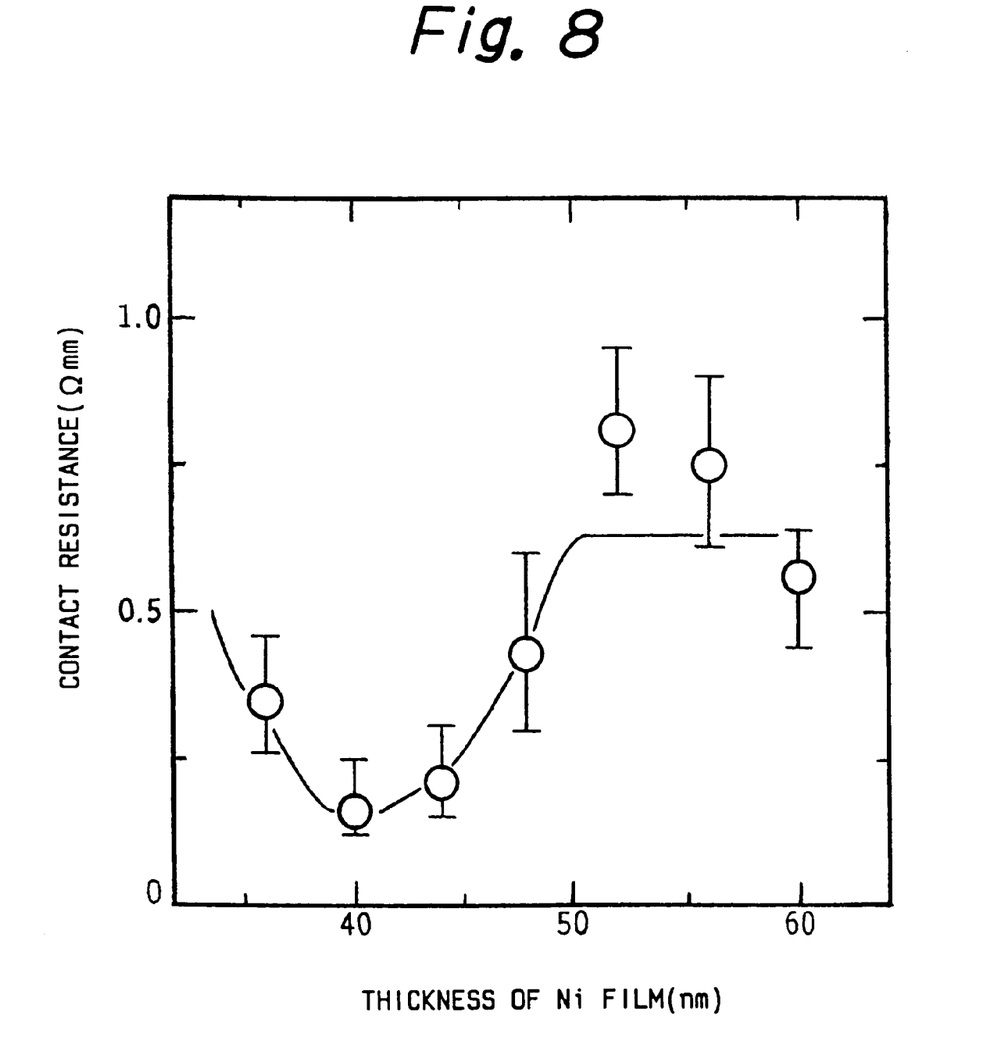
FIG. 8 is a graph showing a result of measurement of changes in contact resistance of the ohmic electrode according to the first embodiment with thickness of the Ni film composing the ohmic electrode.

FIG. 8 shows changes in contact resistance of ohmic electrodes according to the second embodiment in which Au films 37 and Ge films 38 composing the ohmic electrodes are uniformly 5 nm thick and 100 nm thick, respectively, and Ni films 36 are different in thickness. The annealing for making the ohmic electrodes was conducted by the RTA method at 450° C. for five seconds in the atmosphere composed of N₂ gas added with 5% of H₂ gas. FIG. 8 shows that ohmic electrodes exhibit a lowest contact resistance (about 0.2 Ωmm) when the thickness of the Ni film 36 is around 40 nm.

One of the ohmic electrodes exhibiting the lowest contact resistance was observed by an optical microscope. Then, the surface was quite smooth, and the edge was sharp. A cross section of the interfacial portion between the ohmic electrode and the n⁺-type GaAs substrate 31 was also observed by a transmission electron microscope. Then, the interface was uniform, and the depth of diffusion of the metal into the n⁺-type GaAs substrate 31 was as shallow as ~20 nm.

When the Ni film 36, Au film 37 and Ge film 38 are uniformly 40 nm thick, 5 nm thick and 100 nm thick, respectively, their composition ratios relative to the entirety of the Ni film 36, Au film 37 and Ge film 38 are 43.8 atomic percent, 3.5 atomic percent and 52.7 atomic percent, respectively, and corresponding $X_{Ni}/X_{Ge}$ is about 0.83.

Figure 9:
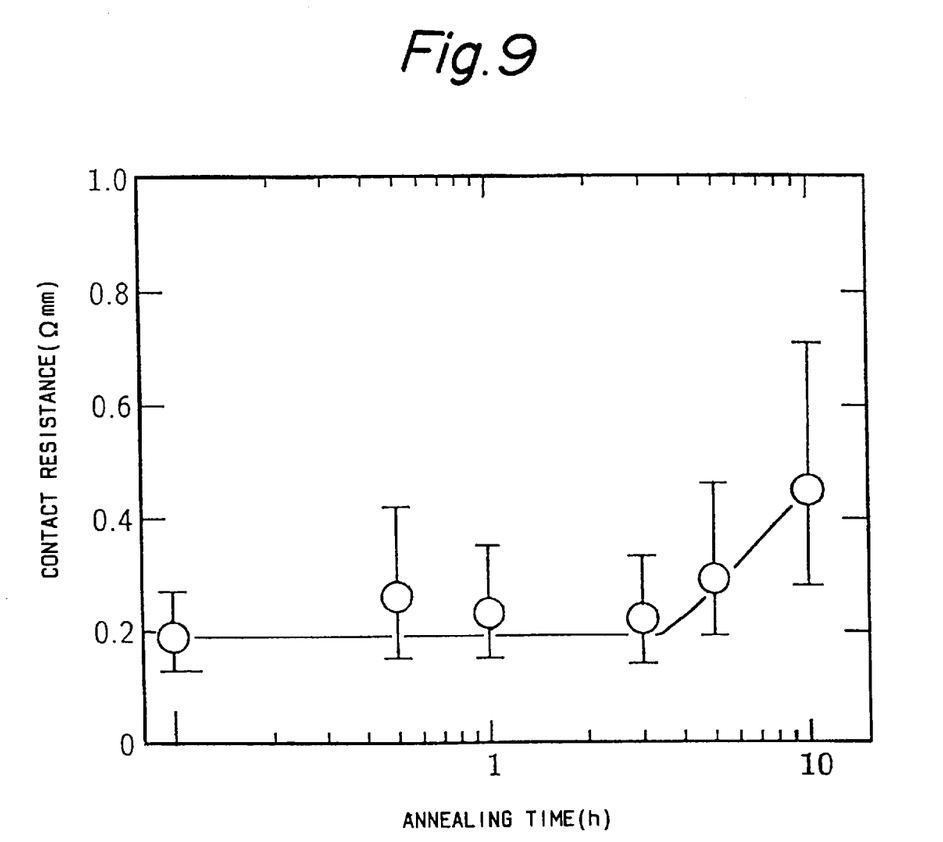
FIG. 9 is a graph showing a result of measurement of thermal stability of the ohmic electrode according to the first embodiment.

FIG. 9 shows a result of measurement of changes in contact resistance of the ohmic electrode with time, that is, thermal stability of the ohmic electrode, when a sample exhibiting the lowest contact resistance was annealed at 400° C. No substantial change in contact resistance is observed in FIG. 9 even with the annealing at 400° C. for about three hours after formation of the ohmic electrode, which means that a good thermal stability has been obtained.

Figure 10:
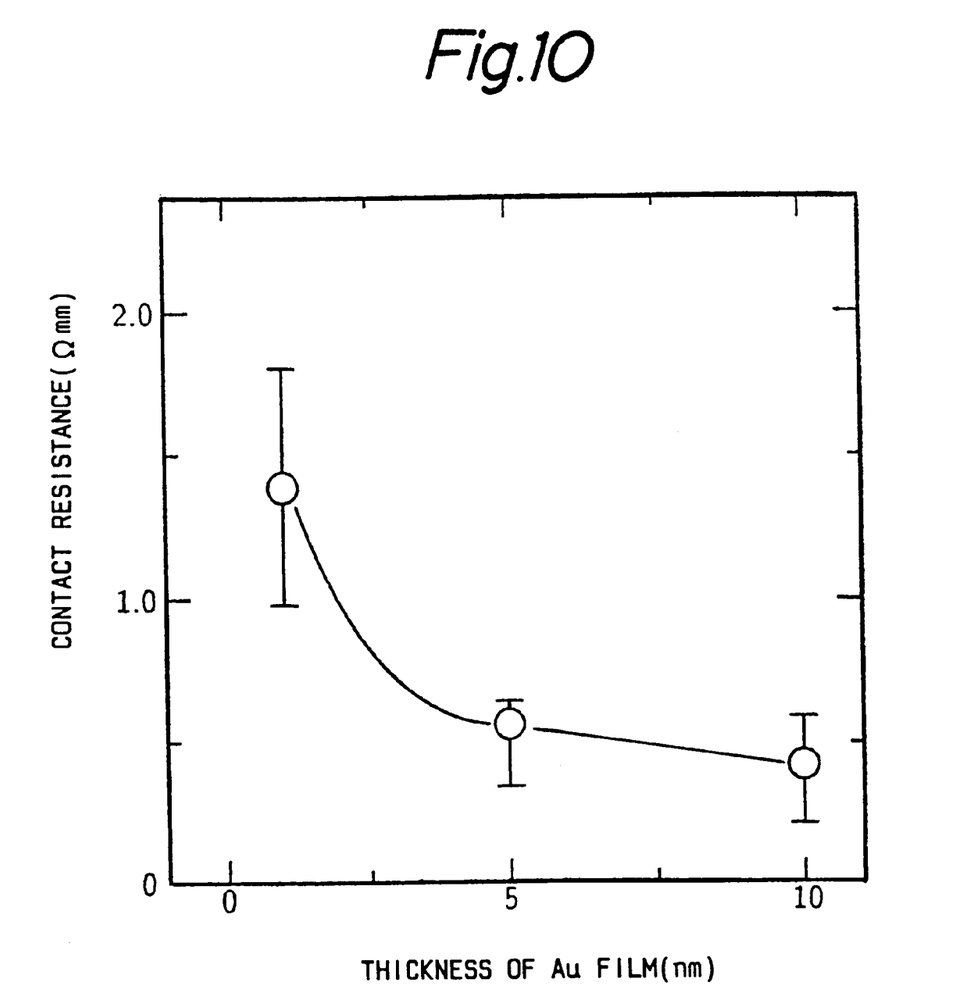
FIG. 10 is a graph showing a result of measurement of changes in contact resistance of the ohmic electrode according to the first embodiment with thickness of the Au film composing the ohmic electrode.

FIG. 10 shows changes in contact resistance of ohmic electrodes according to the second embodiment in which Ni films 36 and Ge films 38 used for fabricating the ohmic electrodes are uniformly 60 nm thick and 100 nm thick, respectively, and the Au films 37 vary in thickness. The annealing for making the ohmic electrodes was conducted by the RTA method at 450° C. for five seconds in the atmosphere composed of N₂ gas added with 5% of H₂ gas. It is clear from FIG. 10 that, with thicknesses of the Au films 37 in the range of 2~10 nm, the contact resistance decreases with increase in thickness of the Au film 37, that is, with increase in composition ratio of the Au film 37 relative to the entirety of the Ni film 36, Au film 37 and Ge film 38.

As described above, the second embodiment can easily make on the n⁺-type GaAs substrate 31 the ohmic electrode composed of the n⁺⁺-type GaAs layer 32 and the NiGe film 33 containing fine particles of the precipitate 34 composed of α'-AuGa having $T_m$=415° C. as shown in FIG. 4, by making a predetermined pattern of the Ni film 36, Au film 37 and Ge film 38 on the n⁺-type GaAs substrate 31 and then annealing the structure at a temperature of 400~750° C., more preferably of about 450~550° C. The ohmic electrode obtained is excellent in thermal stability, surface flatness, and sharpness of the edge, and exhibits a low contact resistance, low film resistance and short diffusion length. In addition, the ohmic electrode can be made by an easy process. Thus, the ohmic electrode is quite excellent for use with GaAs.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, although the method for fabricating an ohmic electrode in the second embodiment makes the Ni film 36, Au film 37 and Ge film 38 in the form corresponding to the ohmic electrode by the so-called lift-off method, the same form of the Ni film 36, Au film 37 and Ge film 38 may be made by first providing the Ni film 36, Au film 37 and Ge film 38 in sequence on the entire surface of the $n^+$-type GaAs substrate 31 and then patterning these films 36, 37 and 38 into the form of the ohmic electrode by etching.

In addition, although the embodiments have been described as applying the invention to ohmic electrodes for $n^+$-type GaAs substrates 31, the invention may be applied to ohmic electrodes for $n^+$-type GaAs layers made by, for example, epitaxial growth.

As described above, according to the ohmic electrode of the invention, ohmic electrodes for III–V compound semiconductors having practically satisfactory characteristics can be realized.

According to the method for fabricating an ohmic electrode of the invention, ohmic electrodes for III–V compound semiconductors having practically satisfactory characteristics can be easily fabricated.

Further, according to the semiconductor device of the invention, high-performance semiconductor devices can be realized, in which ohmic electrodes of semiconductor elemental devices provided on a III–V compound semiconductor body have characteristics practically required in devices.

What is claimed is:

1. A method for fabricating an ohmic electrode comprising a regrown III–V compound semiconductor layer regrown from a III–V compound semiconductor body, and a NiGe film formed on said regrown III–V compound semiconductor layer and including precipitates which are compounds of at least one element selected from a group consisting of Au, Pt, Pd and Ag and a group III element comprising said III–V compound semiconductor body and which has a melting point of 400° or higher, comprising the steps of:

sequentially forming on said III–V compound semiconductor body a Ni film, a metal film comprised of said at least one element selected from the group of Au, Pt, Pd and Ag, and thereafter forming a Ge film, said metal film having a thickness which is less than a thickness of the Ni film and a thickness of the Ge film; and annealing said III–V compound semiconductor body having thereon said Ni film, said metal film and said Ge film.

2. The method for fabricating an ohmic electrode according to claim 1 wherein said regrown III–V compound semiconductor layer has a higher impurity concentration than said III–V compound semiconductor body.

3. The method for fabricating an ohmic electrode according to claim 1 wherein said III–V compound semiconductor body and said regrown III–V compound semiconductor layer are N-type.

4. The method for fabricating an ohmic electrode according to claim 2 wherein said III–V compound semiconductor body and said regrown III–V compound semiconductor layer are N-type.

5. The method for fabricating an ohmic electrode according to claim 1 wherein said III–V compound semiconductor body is composed of GaAs, AlGaAs or InGaAs.

6. The method for fabricating an ohmic electrode according to claim 2 wherein said III–V compound semiconductor body is composed of GaAs, AlGaAs or InGaAs.

7. The method for fabricating an ohmic electrode according to claim 3 wherein said III–V compound semiconductor body is composed of GaAs, AlGaAs or InGaAs.

8. The method for fabricating an ohmic electrode according to claim 1 wherein said regrown III–V compound semiconductor layer is composed of GaAs, AlGaAs or InGaAs.

9. The method for fabricating an ohmic electrode according to claim 2 wherein said regrown III–V compound semiconductor layer is composed of GaAs, AlGaAs or InGaAs.

10. The method for fabricating an ohmic electrode according to claim 3 wherein said regrown III–V compound semiconductor layer is composed of GaAs, AlGaAs or InGaAs.

11. The method for fabricating an ohmic electrode according to claim 4 wherein said regrown III–V compound semiconductor layer is composed of GaAs, AlGaAs or InGaAs.

12. The method for fabricating an ohmic electrode according to claim 1 wherein said metal film is an Au film, and said compound is $\alpha'$-AuGa.

13. The method for fabricating an ohmic electrode according to claim 2 wherein said metal film is an Au film, and said compound is $\alpha'$-AuGa.

14. The method for fabricating an ohmic electrode according to claim 3 wherein said metal film is an Au film, and said compound is $\alpha'$-AuGa.

15. The method for fabricating an ohmic electrode according to claim 4 wherein said metal film is an Au film, and said compound is $\alpha'$-AuGa.

16. The method for fabricating an ohmic electrode according to claim 5 wherein said metal film is an Au film, and said compound is $\alpha'$-AuGa.

17. The method for fabricating an ohmic electrode according to claim 1 wherein said III–V compound semiconductor body is an n-type GaAs substrate, said regrown III–V compound semiconductor layer is an n-type GaAs layer, said at least one element selected from a group consisting of Au, Pt, Pd and Ag is Au, said compound is $\alpha'$-AuGa, and said metal film is an Au film.

18. The method for fabricating an ohmic electrode according to claim 2 wherein said III–V compound semiconductor body is an n-type GaAs substrate, said regrown III–V compound semiconductor layer is an n-type GaAs layer, said at least one element selected from a group consisting of Au, Pt, Pd and Ag is Au, said compound is $\alpha'$-AuGa, and said metal film is an Au film.

19. The method for fabricating an ohmic electrode according to claim 5 wherein said III–V compound semiconductor body is an n-type GaAs substrate, said regrown III–V compound semiconductor layer is an n-type GaAs layer, said at least one element selected from a group consisting of Au, Pt, Pd and Ag is Au, said compound is α'-AuGa, and said metal film is an Au film.

20. The method for fabricating an ohmic electrode according to claim 5 wherein said III–V compound semiconductor body is an n-type GaAs substrate, said regrown III–V compound semiconductor layer is an n-type GaAs layer, said at least one element selected from a group consisting of Au, Pt, Pd and Ag is Au, said compound is α'-AuGa, and said metal film is an Au film.

21. The method for fabricating an ohmic electrode according to claim 8 wherein said III–V compound semiconductor body is an n-type GaAs substrate, said regrown III–V compound semiconductor layer is an n-type GaAs layer, said at least one element selected from a group consisting of Au, Pt, Pd and Ag is Au, said compound is α'-AuGa, and said metal film is an Au film.

22. The method for fabricating an ohmic electrode according to claim 12 wherein said III–V compound semiconductor body is an n-type GaAs substrate, said regrown III–V compound semiconductor layer is an n-type GaAs layer, said at least one element selected from a group consisting of Au, Pt, Pd and Ag is Au, said compound is α'-AuGa, and said metal film is an Au film.

23. The method for fabricating an ohmic electrode according to claim 1 wherein said step of annealing is conducted at an annealing temperature of from 400 to 750° C.

24. The method for fabricating an ohmic electrode according to claim 2 wherein said step of annealing is conducted at an annealing temperature of from 400 to 750° C.

25. The method for fabricating an ohmic electrode according to claim 3 wherein said step of annealing is conducted an annealing temperature of from 400 to 750° C.

26. The method for fabricating an ohmic electrode according to claim 4 wherein said step of annealing is conducted at an annealing temperature of from 400 to 750° C.

27. The method for fabricating an ohmic electrode according to claim 5 wherein said step of annaling is conducted at an anneling temperature of from 400 to 750° C.

28. The method for fabricating an ohmic electrode according to claim 6 wherein the step of annealing is conducted at an annealing temperature of from 400 to 750° C.

29. The method for fabricating an ohmic electrode according to claim 7 wherein said step of annealing is conducted at an annealing temperature of from 400 to 750° C.

30. A method for fabricating an ohmic electrode comprising the steps of:
sequentially forming on a III–V compound semiconductor body a Ni film, a metal film comprised of at least one element selected from the group of Au, Pt, Pd and Ag, and thereafter forming a Ge film, said metal film having a thickness which is less than a thickness of the Ni film and a thickness of the Ge film; and
annealing said III–V compound semiconductor body having thereon said Ni film, said metal film and said Ge film.

31. The method for fabricating an ohmic electrode according to claim 30 wherein said III–V compound semiconductor body is N-type.

32. The method for fabricating an ohmic electrode according to claim 30 wherein said III–V compound semiconductor body is composed of GaAs, AlGaAs or InGaAs.

33. The method for fabricating an ohmic electrode according to claim 31, wherein said III–V compound semiconductor body is composed of GaAs, AlGaAs or InGaAs.

34. The method for fabricating an ohmic electrode according to claim 30 wherein said metal film is an Au film.

35. The method for fabricating an ohmic electrode according to claim 32 wherein said metal film is an Au film.

36. The method for fabricating an ohmic electrode according to claim 30 wherein said III–V compound semiconductor body is an n-type GaAs substrate, and said metal film is an Au film.

37. The method for fabricating an ohmic electrode according to claim 30 wherein said step of annealing is conducted at an annealing temperature of from 400 to 750° C.

38. The method for fabricating an ohmic electrode according to claim 32 wherein said step of annealing is conducted at an annealing temperature of from 400 to 750° C.

39. The method for fabricating an ohmic electrode according to claim 34 wherein said step of annealing is conducted at an annealing temperature of from 400 to 750° C.

40. The method for fabricating an ohmic electrode according to claim 36 wherein said step of annealing is conducted at an annealing temperature of from 400 to 750° C.

41. A method for fabricating an ohmic electrode comprising a regrown III–V compound semiconductor layer regrown from a III–V compound semiconductor body, and a NiGe film formed on said regrown III–V compound semiconductor layer and including precipitates which are compounds of at least one element selected from a group consisting of Au, Pt, Pd and Ag and a group III element comprising said III–V compound semiconductor body and which has a melting point of 400° or higher, comprising the steps of:
sequentially forming on said III–V compound semiconductor body a Ni film, a metal film comprised of said at least one element selected from the group of Au, Pt, Pd and Ag, and thereafter forming a Ge film, said metal film having a thickness which is less than a thickness of the Ni film or a thickness of the Ge film; and
annealing said III–V compound semiconductor body having thereon said Ni film, said metal film and said Ge film to form said precipitates.

42. A method for fabricating an ohmic electrode according to claim 41 wherein said regrown III–V compound semiconductor layer has a higher impurity concentration than said III–V compound semiconductor body.

43. The method for fabricating an ohmic electrode according to claim 41, wherein said III–V compound semiconductor body and said regrown III–V compound semiconductor layer are N-type.

44. The method for fabricating an ohmic electrode according to claim 42 wherein said III–V compound semiconductor body and said regrown III–V compound semiconductor layer are N-type.

45. The method for fabricating an ohmic electrode according to claim 41, wherein said III–V compound semiconductor body is composed of Gas, AlGas or InGas.

46. The method for fabricating an ohmic electrode according to claim 42, wherein said III–V compound semiconductor body is composed of Gas, AlGas or InGas.

47. The method for fabricating an ohmic electrode according to claim 43, wherein said III–V compound semiconductor body is composed of GaAs, AlGaAs or InGaAs.

48. The method for fabricating an ohmic electrode according to claim 41 wherein said regrown III–V compound semiconductor layer is composed of GaAs, AlGaAs or InGaAs.

49. The method for fabricating an ohmic electrode according to claim 42 wherein said regrown III–V compound semiconductor layer is composed of GaAs, AlGaAs or InGaAs.

50. The method for fabricating an ohmic electrode according to claim 44, wherein said regrown III–V compound semiconductor layer is composed of GaAs, AlGaAs or InGaAs.

51. The method for fabricating an ohmic electrode according to claim 41, wherein said metal film is an Au film, and said compound is α'-AuGa.

52. The method for fabricating an ohmic electrode according to claim 42, wherein said metal film is an Au film, and said compound is α'-AuGa.

53. The method for fabricating an ohmic electrode according to claim 43, wherein said metal film is an Au film, and said compound is α'-AuGa.

54. The method for fabricating an ohmic electrode according to claim 44 wherein said metal film is an Au film, and said compound is α'-AuGa.

55. The method for fabricating an ohmic electrode according to claim 45, wherein said metal film is an Au film, and said compound is α'-AuGa.

56. The method for fabricating an ohmic electrode according to claim 41 wherein said III–V compound semiconductor body is an n-type GaAs substrate, said regrown III–V compound semiconductor layer is an n-type GaAs layer, said at least one element selected from a group consisting of Au, Pt, Pd and Ag is Au, said compound is α'-AuGa, and said metal film is an Au film.

57. The method for fabricating an ohmic electrode according to claim 42 wherein said III–V compound semiconductor body is an n-type GaAs substrate, said regrown III–V compound semiconductor layer is an n-type GaAs layer, said at least one element selected from a group consisting of Au, Pt, Pd and Ag is Au, said compound is α'-AuGa, and said metal film is an Au film.

58. The method for fabricating an ohmic electrode according to claim 43, wherein said III–V compound semiconductor body is an n-type GaAs substrate, said regrown III–V compound semiconductor layer is an n-type GaAs layer, said at least one element selected from a group consisting of Au, Pt, Pd and Ag is Au, said compound is α'-AuGa, and said metal film is an Au film.

59. The method for fabricating an ohmic electrode according to claim 45, wherein said III–V compound semiconductor body is an n-type GaAs substrate, said regrown III–V compound semiconductor layer is an n-type GaAs layer, said at least one element selected from a group consisting of Au, Pt, Pd and Ag is Au, said compound is α'-AuGa, and said metal film is an Au film.

60. The method for fabricating an ohmic electrode according to claim 48, wherein said III–V compound semiconductor body is an n-type GaAs substrate, said regrown III–V compound semiconductor layer is an n-type GaAs layer, said at least one element selected from a group consisting of Au, Pt, Pd and Ag is Au, said compound is α'-AuGa, and said metal film is an Au film.

61. The method for fabricating an ohmic electrode according to claim 51, wherein said III–V compound semiconductor body is an n-type GaAs substrate, said regrown III–V compound semiconductor layer is an n-type GaAs layer, said at least one element selected from a group consisting of Au, Pt, Pd and Ag is Au, said compound is α'-AuGa, and said metal film is an Au film.

62. The method for fabricating an ohmic electrode according to claim 41, wherein said step of annealing is conducted at an annealing temperature of from 400 to 750° C.

63. The method for fabricating an ohmic electrode according to claim 42, wherein said step of annealing is conducted at an annealing temperature of from 400 to 750° C.

64. The method for fabricating an ohmic electrode according to claim 43, wherein said step of annealing is conducted at an annealing temperature of from 400 to 750° C.

65. The method for fabricating an ohmic electrode according to claim 44, wherein said step of annealing is conducted at an annealing temperature of from 400 to 750° C.

66. The method for fabricating an ohmic electrode according to claim 45, wherein said step of annealing is conducted at an annealing temperature of from 400 to 750° C.

67. The method for fabricating an ohmic electrode according to claim 46, wherein said step of annealing is conducted at an annealing temperature of from 400 to 750° C.

68. The method for fabricating an ohmic electrode according to claim 47, wherein said step of annealing is conducted at an annealing temperature of from 400 to 750° C.

* * * * *